United States Patent
Pey et al.

[11] Patent Number: 6,153,485
[45] Date of Patent: Nov. 28, 2000

[54] SALICIDE FORMATION ON NARROW POLY LINES BY PULLING BACK OF SPACER

[75] Inventors: Kin-Leong Pey; Soh-Yun Siah, both of Singapore, Singapore

[73] Assignee: Chartered Semiconductor Manufacturing Ltd., Singapore, Singapore

[21] Appl. No.: 09/188,522

[22] Filed: Nov. 9, 1998

[51] Int. Cl.[7] ................................ H01L 21/336
[52] U.S. Cl. ................ 438/305; 438/233; 438/592; 438/723; 438/735; 438/743; 438/647; 438/299
[58] Field of Search ................... 438/723, 735, 438/343, 592, 233, 647

[56] References Cited

U.S. PATENT DOCUMENTS

| | | | |
|---|---|---|---|
| 4,912,061 | 3/1990 | Nasr | 437/44 |
| 5,462,888 | 10/1995 | Chiu et al. | |
| 5,683,941 | 11/1997 | Kao et al. | |
| 5,731,239 | 3/1998 | Wong et al. | 438/296 |
| 5,773,348 | 6/1998 | Wu | |
| 5,888,903 | 3/1999 | O'Brien et al. | |
| 5,937,315 | 8/1999 | Xiang et al. | |
| 5,966,597 | 10/1999 | Wright | |
| 6,001,697 | 12/1999 | Chang et al. | |
| 6,001,698 | 12/1999 | Kuroda | |
| 6,001,721 | 12/1999 | Huang | |
| 6,010,954 | 1/2000 | Ho et al. | |
| 6,022,795 | 2/2000 | Dhen et al. | |
| 6,025,254 | 2/2000 | Doyle et al. | |

*Primary Examiner*—Richard Booth
*Assistant Examiner*—Jonathan Hack
*Attorney, Agent, or Firm*—George O. Saile; Rosemary L. S. Pike; William J. Stoffel

[57] ABSTRACT

A method for a salicide process where S/D silicide contacts are formed in a separate silicide step than the gate silicide contacts. Preferably, $TiSi_2$ is formed on S/D regions and $TiSi_2$ or $CoSi_2$ is formed on Poly electrodes (lines or gates) by etching back a sidewall spacer on the poly electrodes. The invention has two silicide steps. The $TiSi_2$ is formed over the S/D regions while the gate electrode is protected by a silicon nitride Cap layer. Next, an ILD layer formed over the S/D regions. The interlevel dielectric (ILD) layer, cap layer and spacers on the sidewalls of the gate electrodes are etched back. The invention has two embodiments for the composition of the spacers. In a second silicide step, Titanium silicide ($TiSi_x$ or $TiSi_2$) or Cobalt silicide ($CoSi_x$ or $CoSi_2$) is formed on the top and sidewalls of the electrodes. A key feature of the invention is that the gate contact silicide is formed on the top and sidewalls of the electrodes.

7 Claims, 3 Drawing Sheets

SALICIDE FORMATION ON NARROW POLY LINES BY PULLING BACK OF SPACER

BACKGROUND OF INVENTION

1) Field of the Invention

The present invention relates, in general, to semiconductor device production, and more particularly, to gate contact and Source/Drain contact fabrication techniques for use in semiconductor production. The present invention relates to the fabrication of integrated circuit devices on semiconductor substrates, and more particularly relates to a method for making sub-quarter-micrometer gate electrodes by using a self-aligned mask to selectively form a low resistance gate contacts of titanium silicide or Cobalt silicide layer or other metal silicide films.

2) Description of the Prior Art

Advances in the semiconductor process technologies in recent years have dramatically decreased the device feature size and increased the circuit density and performance on integrated circuit chips. The field effect transistor (FET) is used extensively for Ultra Large Scale Integration (ULSI). These FETs are formed using polysilicon gate electrodes and self-aligned source/drain contact areas.

The conventional FETs are typically fabricated by patterning polysilicon gate electrodes over a thin gate oxide on a single crystal semiconductor substrate. The gate electrode structure is used as a diffusion or implant barrier mask to form self-aligned source/drain areas in the substrate adjacent to the sides of the gate electrode. The distance from the source junction to drain junction under the gate electrode is defined as the channel length of the FET.

Advances in semiconductor technologies, such as high resolution photolithographic techniques and anisotropic plasma etching, to name a few, have reduced the minimum feature sizes on devices to less than a quarter-micrometer. For example, FETs having gate electrodes with widths less than 0.35 micrometers (um), and channel lengths that are less than the gate electrode width are currently used in the industry.

However, as this downscaling continues and the channel length is further reduced, the FET device experiences a number of undesirable electrical characteristics. One problem associated with these narrow gate electrodes is the high electrical sheet resistance which impairs the performance of the integrated circuit.

One method of circumventing this problem is to form on the gate electrode a metal silicide layer that substantially reduces the sheet resistance of the polysilicon gate electrode, and also the local electrical interconnecting lines made from the same polysilicon layer. A typical approach is to use a salicide process. In this process the polysilicon gate electrodes are patterned over the device areas on the substrate. Insulating sidewall spacers are formed on the sidewalls of the gate electrodes, and source/drain areas are implanted adjacent to the gate electrodes. Using the salicide process, a metal is deposited over the polysilicon gate electrodes and the self-aligned source/drain areas, and sintered to form a silicide layer on the polysilicon gates and silicide contacts in the source/drain areas. The unreacted metal on the insulating layer is selectively removed. Unfortunately, the formation of these salicide gate electrodes can result in undesirable effects, such as residual metal or silicide stringers extending over the narrow spacers causing electrical shorts between the gate electrodes and the source/drain areas.

A second problem results from forming titanium silicide on sub-quarter-micrometer FETs. The problem is that it is difficult to form low sheet resistance silicide on these sub-0.25-micrometer (um) gate lengths. One method to circumvent this problem is to use a cobalt or a nickel silicide to replace the titanium silicide. An alternative method to improve the sheet resistance is to amorphize the polysilicon layer by ion implantation prior to forming the titanium silicide. Still another problem arises if the polysilicon is amorphized by ion implantation using the salicide process. The implantation that occurs in the source/drain areas can result in crystalline damage, which can adversely affect the electrical characteristics of the device, and is not easily annealed out. Therefore it would be desirable to have a process that avoids this implant in the source/drain areas.

Performing salicidation on narrow poly lines in the deep-sub micron regime is getting extremely difficult especially the poly line width effect. New silicide materials such as $CoSi_2$ and $NiSi_2$ have shown promising results but have yet to be implemented in the manufacturing as a viable process.

Basically, the diffusion coefficient of Co in Si is very high and as such, it is very hard to control the distribution of Co in the S/D region. However, Co has shown to be a very useful starting material for forming $CoSi_2$ on the narrow poly lines due to its extremely small grains. $NiSi_2$ is still at its infancy development since the major concern is its thermal stability at high temperature.

Therefore, there is still a strong need in the semiconductor industry for making sub-quarter-micrometer gate electrodes having lower sheet resistance using improved silicide techniques, and for controlling manufacturing costs by reducing the number of photoresist masking steps and other processing steps.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 5,731,239(Wong) shows a method of forming self aligned silicide contacts to the top of poly lines by etching back the oxide on top of the line. U.S. Pat. No. 4,912,061(Nasr) shows a disposable SiN spacer for a salicide process. However, these processes can be further improved.

SUMMARY OF THE INVENTION

It is an object of the present invention to provide a method for fabricating a salicide process on narrow polysilicon lines by pulling back a spacer over the poly lines.

It is an object of the present invention to provide a method for fabricating a salicide process where $TiSi_2$ is formed on S/D regions and $TiSi_x$ or $CoSi_2$ is formed on Poly lines (or gates) by pulling back a spacer over the poly lines.

It is an object of the present invention to provide a method for fabricating a salicide process that eliminates gate to S/D leakage due to the salicide process by pulling back a spacer over the poly lines.

The present invention provides a method for fabricating a salicide process where $TiSi_2$ 23 is formed on S/D regions 22 and $TiSi_2$ or $CoSi_2$ 32 is formed on Poly lines (or gates) by pulling back a spacer 21A over the poly lines 16 18. See FIG. 5.

The invention is a method for fabricating a salicide process where $TiSi_2$ 23 is formed on Source/Drain (S/D) regions 22 and TiSix or CoSi2 32 is formed on electrodes 16 18 (Poly lines or gates) by etching back a spacer 21A over the electrodes 16 18. The invention has two silicide steps— one for the S/D contacts 23 and a second for the gate contact 32. For the first silicide step, the $TiSi_2$ is formed over the S/D regions while the gate electrode is protected by a Cap layer 20. Next, an ILD layer 28A is formed over the S/D regions 22. The ILD layer is chemical-mechanical polished back to the cap layer. The ILD layer, cap layer 20 and spacers 21 on the sidewalls of the gate electrodes are etched back. In a second silicide step, preferably Titanium silicide ($TiSi_x$ or $TiSi_2$) or Cobalt silicide ($CoSi_x$ or $CoSi_2$) 32 is formed on the top and the exposed sidewalls of the electrodes 16 18. Key features of the invention are the (1) $TiSi_2$ or $CoSi_2$ is formed on the top and (2) the exposed sidewalls of the electrodes 16 18.

There are two embodiments for the composition of the spacer 21: (a) silicon nitride or (b) $SiO_2$ (e.g., TEOS).

The invention has many benefits over the prior art. In view of the problems discussed in the prior art section, it is a wise approach to fabricate $TiSi_2$ on the S/D regions and $TiSi_2$ or $CoSi_2$ on the poly lines. Based on our study, uniform and good salicide can be formed on the narrow poly lines if the constraint imposed by spacer is removed. It is believed that the stress induced by the spacer has severely retarded the salicidation process. In addition, the exposed sidewall of the poly lines has provided more free space (indirectly related to the line width) for the diffusion of species before the formation of the silicide compound.

The invention provides the following benefits:
☐ Self-aligned silicide ($TiSi_2$ or $CoSi_2$) can be easily formed on the deep-sub micron poly lines.
☐ Gate to S/D leakage is almost eliminated. By partially removal of the spacer 21A, the gate to S/D leakage is completely eliminated.
☐ Part of the spacer 21A is removed to give more room for the salicidation on the poly lines 16 without sacrificing the Gate to S/D leakage.

Additional objects and advantages of the invention will be set forth in the description that follows, and in part will be obvious from the description, or may be learned by practice of the invention. The objects and advantages of the invention may be realized and obtained by means of instrumentalities and combinations particularly pointed out in the append claims.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention to provides a method for fabricating a salicide process where $TiSi_2$ 23 is formed on S/D regions 22 and $TiSi_2$ or $CoSi_2$ 32 or other metal silicides is formed on Poly lines (or gates) by pulling back a spacer 21A over the poly lines 16 18. See FIG. 5.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

Figure 1:
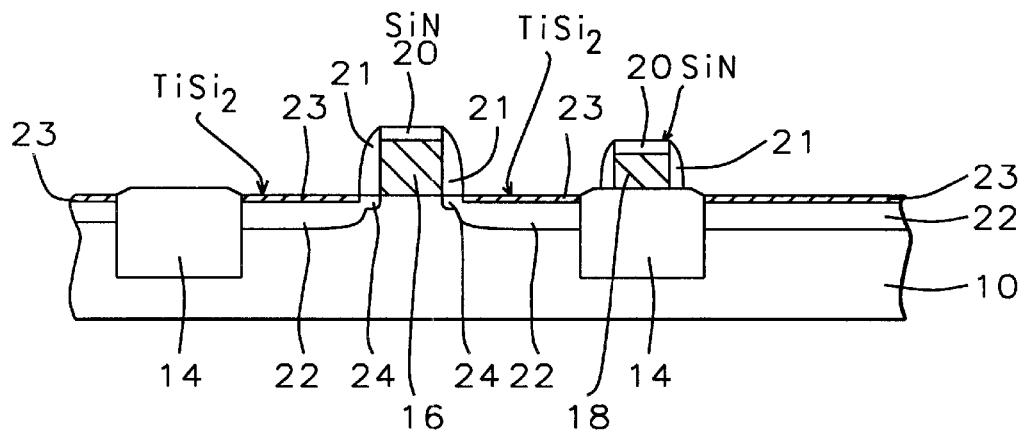
FIGS. 1 and 2, are cross sectional views for illustrating a method for manufacturing a Salicide contact to a gate with etched back spacers 21A according to the present invention.

FIG. 1 shows the starting step of providing a semiconductor substrate 10. Within the present invention, the substrate may be a substrate employed within a microelectronics fabrication selected from the group including but not limited to integrated circuit microelectronics fabrications, solar cell microelectronics fabrications, ceramic substrate microelectronics fabrications and flat panel display microelectronics fabrications. Although not specifically illustrated within the schematic cross-sectional diagram of FIG. 1, the substrate 10 may be the substrate itself employed within the microelectronics fabrication, or in the alternative, the substrate may be the substrate employed within tile microelectronics fabrication, where the substrate has formed thereupon or thereover any of several additional microelectronics layers as are conventionally employed within the microelectronics fabrication. Such additional microelectronics layers may include, but are not limited to, microelectronics conductor layers, microelectronics semiconductor layers and microelectronics dielectric layers.

In this example, a retrograde well (not shown) is formed.

Next, we form preferably shallow trench isolation regions 14 surrounding and electrically isolating device areas.

A gate oxide layer (not shown) is then formed on the device areas.

A polysilicon layer is then formed 16 18 on the substrate. The polysilicon layer thickness in a range of between about 1500 and 2500 Å. The polysilicon layer is doped A poly chemical-mechanical polish (CMP) process can be employed to polish the deposited poly Si films.

The advantages of the CMP on poly are: (a) Obtain better planarity between poly on active and on STI and (b) to provide a flatter surface for the oxide CMP on ILD. If the poly CMP process is used, the starting poly thickness is between about 2500 and 4000 Å.

Next we deposit a silicon nitride layer 20 on the polysilicon layer 16 18. The silicon nitride layer and the polysilicon layer are patterned by photoresist masking and anisotropic etching leaving portions over the device areas to form the gate electrodes 16 and to form electrical interconnections 18 (e.g., gate electrode or conductive lines) over the shallow trench isolation regions. The term "electrode" refers to both the gate electrodes 16 and the interconnections 18. The gate electrodes 16 and the interconnections 18 having cap layers 20 thereover. The electrodes/interconnections 16 18 preferably have a thickness in a range of between about 1500 and 2500 Angstroms. The cap layers 20 preferably have a thickness in a range of between about 500 and 1500 Angstroms.

Subsequently, we form lightly doped source/drain areas 24 adjacent to the gate electrodes 16 by ion implantation.

Now, sidewall spacers 21 are formed on the gate electrodes. The sidewall spacers 21 are preferably composed of silicon nitride or silicon oxide and more preferably of composed of silicon nitride for deep quarter micron technologies.

There are two embodiments where the spacers are formed of ①　oxide and ②　nitride. These 2 embodiments will be discussed below. See FIGS. 4A and 4B.

The sidewall spacers preferably have a width in a range of between about 600 and 1000 Å. The sidewall spacers 21 are preferably formed by depositing a first insulating layer over the gate electrodes 16 18 and elsewhere on the substrate; and anisotropically etching back the first insulating layer.

Still referring to FIG. 1, we form source/drain regions 22 by ion implantation adjacent to the sidewall spacers 21.

Now we deposit a first metal layer (e.g., titanium (Ti)) and anneal the substrate to form a first metal silicide 23 on the source/drain regions 22 (S/D contacts) while leaving unreacted titanium on insulated surfaces of the substrate.

The first metal layer preferably has a thickness between about 300 and 450 Angstroms and the first metal layer is annealed (first RTA) by rapid thermal annealing in a temperature range of between about 650° and 740° C. for a time of between about 20 and 40 seconds.

The unreacted first metal (e.g., titanium) layer (not shown) is stripped from the spacer 21 and the STI oxide 14. No silicide is formed on the poly lines 16 18 since they are capped with silicon nitride. The $TiSi_2$ film is then rapid thermal annealed ($2^{nd}$ RTA) one more time, in a temperature range of between about 800° and 900° C. for a time of between about 20 and 40 seconds. To review, a summary of the metal silicide process is: ①　deposit Ti metal, ②　$1^{st}$ RTA, ③　strip unreacted Ti, and ④　$2^{nd}$ RTA.

Figure 2:
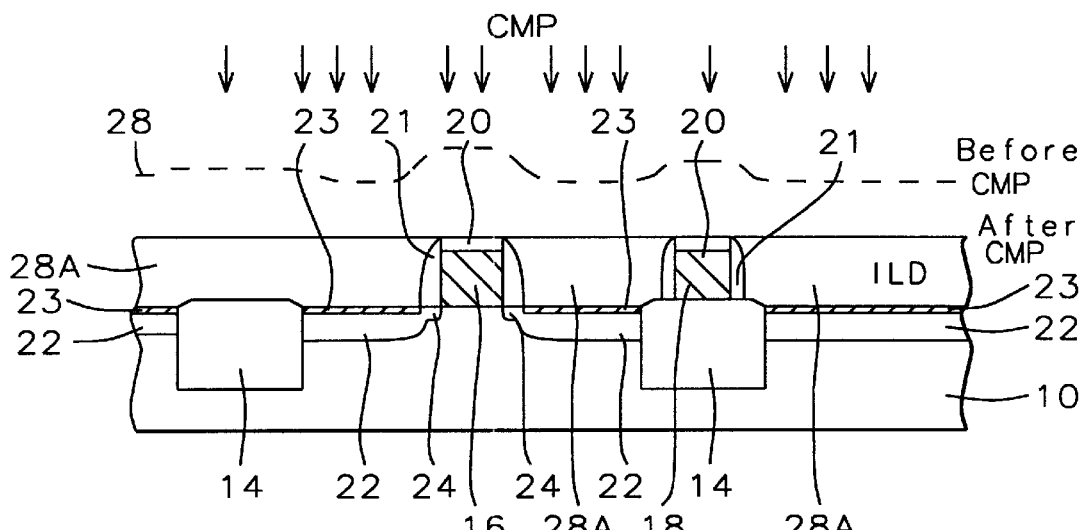

FIG. 2 shows the step of depositing an interlevel dielectric layer (ILD) 28 on the substrate 10. The interlevel dielectric layer 28 having a thickness in a range of between about 10000 and 18000 Angstroms and the ILD layer is preferably composed of silicon oxide.

The interlevel dielectric layer 28A is preferably chemical/mechanically polished to the cap layers 20 on the gate electrodes 16 18. Due to the good poly planarity developed in the previous poly CMP, oxide 28 remaining on the $Si_3N_4$ layer 20 of the poly lines 16 18 on active and STI 14 will not be an issue.

After the chemical-mechanical polishing, the interlevel dielectric layer 28A preferably has a thickness in a range of between about 2100 and 3500 Å.

Figure 3A:
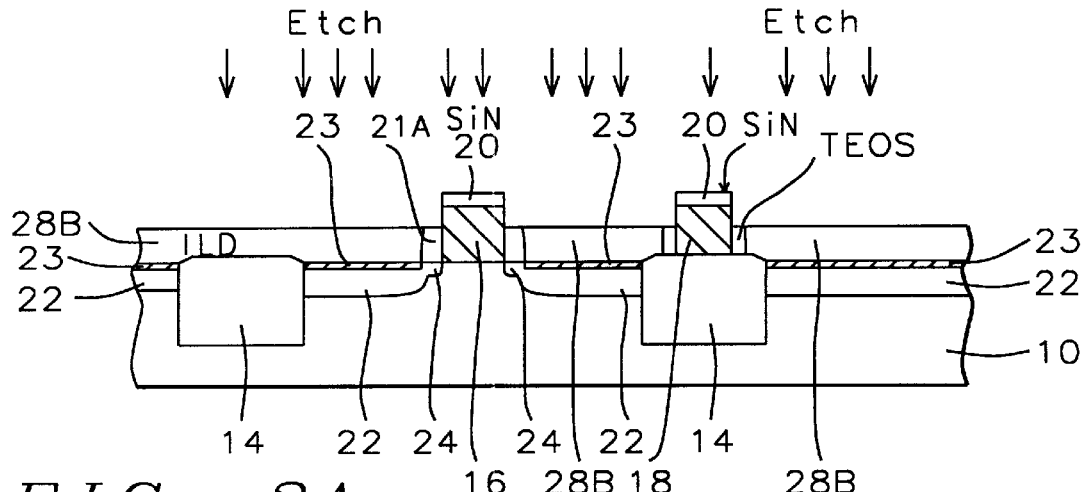
FIGS. 3A and 4A are cross sectional views showing the etch back of a TEOS spacer 21A according to a first embodiment of the present invention.
Figure 3B:
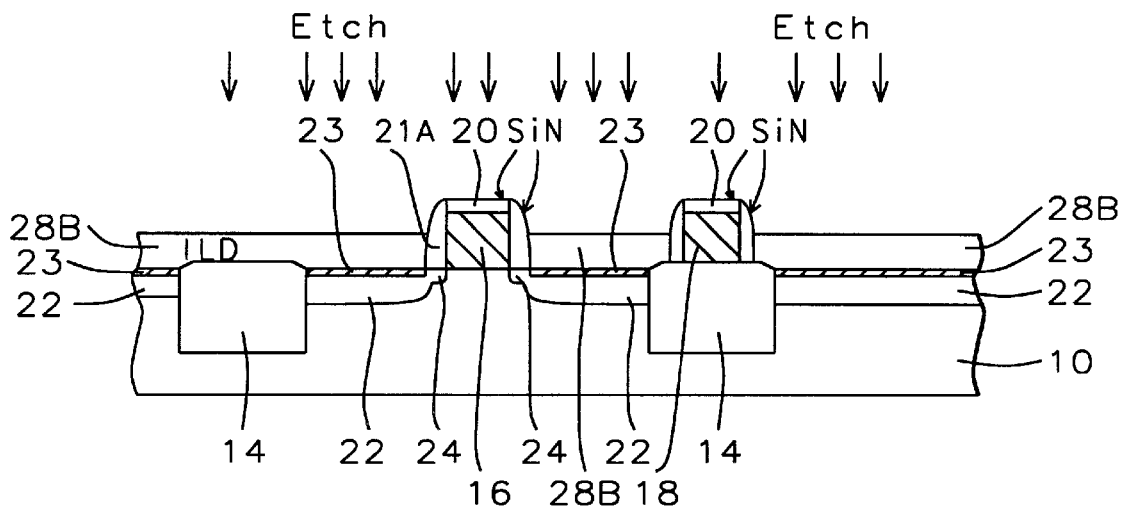
FIGS. 3B and 4B are cross sectional views showing the etch back of a silicon nitride spacer 21A according to a second embodiment the present invention.

FIGS. 3A and 3B show the step of etching back the interlevel dielectric layer 28A a level below the top of the gate electrodes 16 18. The top of the interlevel dielectric layer 28B is etched below the top of the gate electrode by a distance 17 (See FIG. 4A—distance 17 is the distance between the top of the poly 16 to the surface of the IDL layer 28A) in a range of between about 500 and 1000 Å; and etching back the sidewall spacer 21 exposing at least a top portion of the gate electrodes. The remaining sidewall spacer 21A is shown in the FIGS. 4A and 4B.

FIG. 3A shows the $1^{st}$ embodiment where the spacer 21 is formed of TEOS. The spacer 21 is partially etched by the ILD layer 28B etchback.

FIG. 3B shows the $2^{nd}$ embodiment where the spacer 21 is formed of silicon nitride. The SiN space 21 is not etched back with ILD etch.

Next, the cap layer (e.g., SiN) 20 is removed in a SiN selective etch (e.g., Hot $H_3PO_4$) to expose the top of the electrodes 16 18.

Figure 4A:
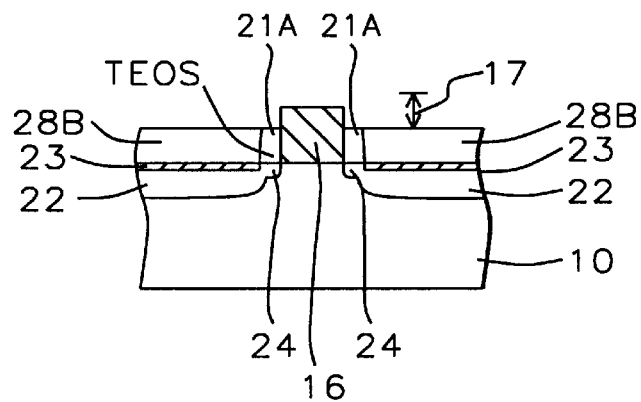

FIG. 4A shows a $1^{st}$ embodiment where the (bottom spacer 21A) remaining spacer 21A is composed of TEOS.

The TEOS spacer—poly sidewall will be exposed by the IDL dry etching. FIG. 4A shows that the spacer 21 is etched back during the ILD layer etch to from a remaining spacer (bottom spacer) 21A and to expose upper sidewalls of the electrodes 18 and gate electrodes 16.

Figure 4B:
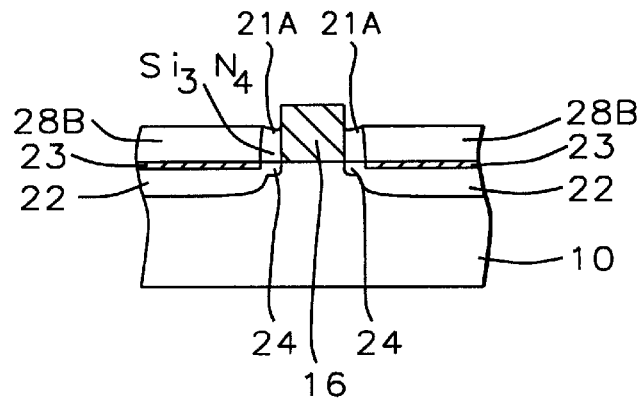

FIG. 4B shows a $2^{nd}$ embodiment where the spacer 21 is composed of silicon nitride. FIG. 4b shows that the spacer 21 is not etched back during the ILD layer etch. But the spacer 21 is etched back in the same etch that removes the Cap layer 20 to leave a remaining spacer 21A. The etch step uses a SiN selective etch (e.g., hot $H_3PO_4$) to expose upper sidewalls of the electrodes 18 and gate electrodes 16.

As a result, part of the spacer, whether the spacer 21 is TEOS or $Si_3N_4$ is removed so as to expose more sidewall area of the poly lines for silicide reaction with Ti or Co. Another advantage of this process is that the leakage path, if exists/forms during the S/D salicidation, will be completely removed, eliminating the gate to S/D leakage.

Next we selectively remove the cap layers 20 over the gate electrodes 16 by wet etching while leaving the second insulating layer as a self-aligning implant mask.

In an optional step, we implant ions in the gate electrodes composed of the polysilicon layer thereby amorphizing the surface of the polysilicon layer, while masking the source/drain contact areas protected by the second insulating layer.

Figure 5:
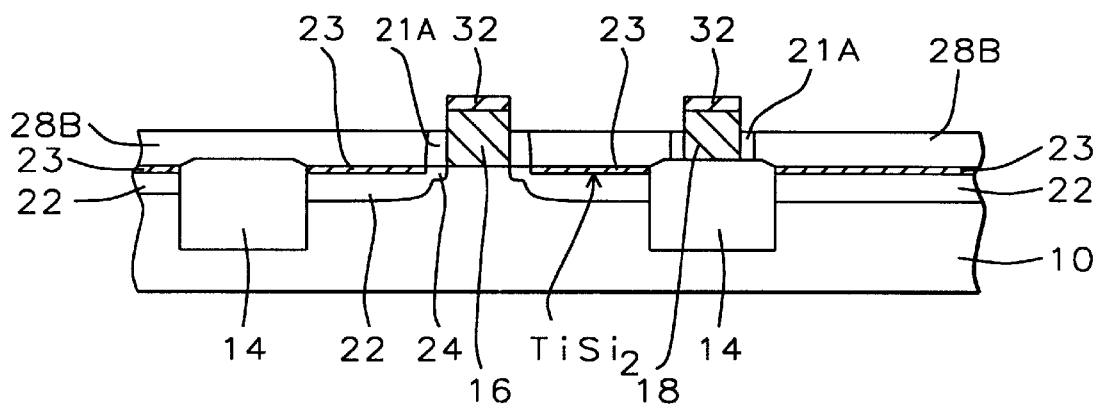
FIG. 5 shows a cross sectional view of the electrodes having a top silicide gate contact according to the present invention.

FIG. 5 shows the performance of the second salicidation on the poly lines which do not impose too much constraint in terms of line width effect (as shown in FIGS. 1 and 2). Since S/D regions are not exposed, Gate to S/D leakage is totally eliminated.

FIG. 5 shows the step of depositing a second metal layer and annealing to form a second metal silicide layer 32 on the gate electrodes while leaving on the insulating layer unreacted portions of the second metal layer.

The second metal layer preferably has a thickness of between about 200 and 450 Angstroms and the second metal silicide layer 32 composed of $TiSi_2$, $CoSi_2$, and other metal silicides such as $NiSi_2$, $Ni(alloy)Si_x$.

The second metal layer is first annealed by rapid thermal annealing in a temperature range of between about 400° and 700° C. for a time of between about 20 and 40 seconds. The unreacted metal is then selectively removed. A second rapid thermal anneal is performed at a temperature range of between about 700° and 900° C. for a time of between about 20 and 40 seconds.

Following this, an insulating layer is formed covering the electrodes. Conductive layers and insulating layers are formed thereover to make electronic devices as is known to those skilled in the art.

Benefits of the Invention

The invention provides the following benefits:
- Self-aligned silicide ($TiSi_2$ or $CoSi_2$) can be easily formed on the deep-sub micron poly lines.
- Gate to S/D leakage is almost eliminated. By partially removal of the spacer 21A, the gate to S/D leakage is completely eliminated.
- Part of the spacer 21A is removed to give more room for the salicidation on the poly lines 16 18 without sacrificing the Gate to S/D leakage.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method for fabricating field effect transistors having low sheet resistance gate electrodes comprising the steps of:
   a) providing a substrate;
   b) forming shallow trench isolation regions surrounding and electrically isolating device areas;
   c) forming a gate oxide layer on said device areas;
   d) depositing a polysilicon layer over said substrate;
   e) depositing a silicon nitride layer on said polysilicon layer;
   f) patterning said silicon nitride layer and said polysilicon layer to form electrodes over said device areas and over said shallow trench isolation regions; said electrodes having cap layers formed from the patterned silicon nitride layer thereover;
   g) forming sidewall spacers on said electrodes; said sidewall spacers are composed of silicon nitride;
   h) forming source/drain regions by ion implantation adjacent to said sidewall spacers in said device areas;
   i) depositing a first metal layer on said source/drain regions and annealing said substrate to form a first metal silicide on said source/drain regions;
   j) depositing an interlevel dielectric layer on said substrate;
   k) chemical mechanically polishing said interlevel dielectric layer down to said cap layers on said electrodes;
   l) etching back said interlevel dielectric layer to a level below the top of said electrodes; the etching back of said interlevel dielectric layer so that the top of said interlevel dielectric layer is below said top of said electrode by a distance in a range of between about 500 and 1000 Å; and etching back said sidewall spacer exposing a top portion of said electrodes; and removing said cap layers over said electrodes; and implanting ions in said electrodes composed of said polysilicon layer thereby amorphizing the surface of said polysilicon layer, where said source/drain contact areas are protected by said second insulating layer
   m) depositing a second metal layer and annealing to form a second metal silicide layer on said electrodes while leaving on said insulating layer unreacted portions of said second metal layer;
   n) stripping said unreacted second metal layer on said second insulating layer, thereby completing said field effect transistors having said low sheet resistance.

2. The method of claim 1 wherein said electrodes have a thickness in a range of between about 1500 and 2500 Angstroms and said cap layers have a thickness in a range of between about 500 and 1500 Angstroms and said sidewall spacers have a width in a range of between about 600 and 1000 Å.

3. The method of claim 1 wherein said first metal layer having a thickness between about 300 and 450 Angstroms and said first metal layer is annealed by rapid thermal annealing in a temperature range of between about 650° and 740° C. for a time of between about 20 and 40 seconds; and stripping said unreacted first metal layer from said substrate; and performing a second rapid thermal anneal at a temperature range of between about 800° and 900° C. for a time of between about 20 and 40 seconds.

4. The method of claim 1 wherein after the chemical-mechanical polishing, said interlevel dielectric layer having a thickness in a range of between about 2100 and 3500 Å.

5. The method of claim 1 wherein said second metal layer has a thickness of between about 200 and 450 Angstroms and said second metal silicide layer composed of a material selected from the group consisting of $TiSi_2$, $CoSi_2$ and $NiSi_x$; and Step (m) further includes said second metal layer is annealed by rapid thermal annealing in a temperature range of between about 400° and 700° C. for a time of between about 20 and 40 seconds; and stripping said unreacted second metal layer; and performing a second rapid thermal anneal at a temperature in a range of between about 700° and 900° C. for a time of between about 20 and 40 seconds.

6. A method for fabricating field effect transistors having low sheet resistance electrodes using spacers composed of silicon nitride comprising the steps of:
   a) providing a substrate;
   b) forming shallow trench isolation regions surrounding and electrically isolating device areas;
   c) forming a gate oxide layer on said device areas;
   d) depositing a polysilicon layer over said substrate; said polysilicon layer has a thickness of between about 1500 and 2500 Angstroms;
   e) depositing a silicon nitride layer on said polysilicon layer;
   f) patterning said silicon nitride layer and said polysilicon layer to form electrodes over said device areas and over said shallow trench isolation regions; said electrodes having cap layers formed from the patterned silicon nitride layer thereover;
      (1) said electrodes having a thickness in a range of between about 1500 and 2500 Angstroms;
      (2) said cap layers have a thickness in a range of between about 500 and 1500 Angstroms;
   g) forming lightly doped source/drain regions adjacent to said electrodes by ion implantation;
   h) forming sidewall spacers on said electrodes; said sidewall spacers composed of silicon nitride;
      (1) said sidewall spacers have a width in a range of between about 600 and 1000 Å;
   i) forming source/drain regions by ion implantation adjacent to said sidewall spacers in said device areas;
   j) depositing a first metal layer on said source/drain regions and annealing said substrate to form a first metal silicide on said source/drain regions
      (1) said first metal layer having a thickness between about 300 and 450 Angstroms and said first metal layer is annealed by rapid thermal annealing in a temperature range of between about 650° and 740° C. for a time of between about 20 and 40 seconds, stripping said unreacted first metal layer from said substrate; and performing a second rapid thermal anneal at a temperature range of between about 800° and 900° C. for a time of between about 20 and 40 seconds;
   k) depositing an interlevel dielectric layer on said substrate;

(1) said interlevel dielectric layer having a thickness in a range of between about 10,000 and 18,000 Angstroms;

l) chemical/mechanically polishing said interlevel dielectric layer down to said cap layers on said electrodes;
  (1) after the chemical-mechanical polishing, said interlevel dielectric layer has a thickness in a range of between about 2100 and 3500 Å;

m) etching back said interlevel dielectric layer to a level below the top of said electrodes; the top of said interlevel dielectric layer below said top of said electrode by a distance in a range of between about 500 and 1000 Å; and etching back said sidewall spacer exposing a top portion of said electrodes; and removing said cap layers over said electrodes;

n) implanting ions in said electrodes composed of said polysilicon layer thereby amorphizing the surface of said polysilicon layer, while masking said source/drain contact areas protected by said second insulating layer;

o) depositing a second metal layer and annealing to form a second metal silicide layer on said electrodes while leaving on said insulating layer unreacted portions of said second metal layer;
  (1) said second metal layer has a thickness of between about 200 and 450 Angstroms and said second metal silicide layer composed of a material selected from the group consisting of $TiSi_2$, $CoSi_2$ and $NiSi_x$;
  (2) said second metal layer is annealed by rapid thermal annealing in a temperature range of between about 400° and 700° C. for a time of between about 20 and 40 seconds; stripping said unreacted second metal layer and performing a second rapid thermal anneal at a temperature in a range of between about 800° and 900° C. for a time of between about 20 and 40 seconds.

7. A method for fabricating field effect transistors having low sheet resistance electrodes using spacers composed of silicon nitride comprising the steps of:

a) providing a substrate;

b) forming shallow trench isolation regions surrounding and electrically isolating device areas;

c) forming a gate oxide layer on said device areas;

d) depositing a polysilicon layer over said substrate;

e) depositing a silicon nitride layer on said polysilicon layer;

f) patterning said silicon nitride layer and said polysilicon layer to form electrodes over said device areas and over said shallow trench isolation regions; said electrodes having cap layers formed from the patterned silicon nitride layer thereover; said electrodes having a thickness in a range of between about 1500 and 2500 Å; said cap layers have a thickness in a range of between about 500 and 1500 Å;

g) forming lightly doped source/drain regions adjacent to said electrodes by ion implantation;

h) forming sidewall spacers on said electrodes; said sidewall spacers composed of silicon nitride; said sidewall spacers have a width in a range of between about 600 and 1000 Å;

i) forming source/drain regions by ion implantation adjacent to said sidewall spacers in said device areas;

j) depositing a first metal layer on said source/drain regions and annealing said substrate to form a first metal silicide on said source/drain regions k) depositing an interlevel dielectric layer on said substrate;

l) chemical/mechanically polishing said interlevel dielectric layer down to said cap layers on said electrodes; said interlevel dielectric layer having a thickness in a range of between about 2100 and 3500 Å;

m) etching back said interlevel dielectric layer to a level below the top of said electrodes; the etch back of said interlevel dielectric layer is to a level so that the top of said interlevel dielectric layer below said top of said electrode by a distance in a range of between about 500 and 1000 Å; and implanting ions in said electrodes composed of said polysilicon layer thereby amorphizing the surface of said polysilicon layer, while masking said source/drain contact areas protected by said second insulating layer;

n) etching back said sidewall spacer exposing a top portion of said electrodes and removing said cap layers over said electrodes using a selective silicon nitride etch;

o) depositing a second metal layer and annealing to form a second metal silicide layer on said electrodes while leaving on said insulating layer unreacted portions of said second metal layer; said second metal layer has a thickness of between about 200 and 450 Å and said second metal silicide layer composed of a material selected from the group consisting of $TiSi_2$, $CoSi_2$ and $NiSi_x$;

p) stripping said unreacted second metal layer on said second insulating layer, thereby completing said field effect transistors having said low sheet resistance.

* * * * *